(12) United States Patent
Mimken et al.

(10) Patent No.: US 6,264,036 B1
(45) Date of Patent: Jul. 24, 2001

(54) PROCESS CASSETTE

(75) Inventors: Victor B. Mimken; Thomas Krawzak, both of Boise, ID (US)

(73) Assignee: SCP Global Technologies, Inc., Boise, ID (US)

( * ) Notice: Subject to any disclaimer, the term of this patent is extended or adjusted under 35 U.S.C. 154(b) by 0 days.

(21) Appl. No.: 09/263,344

(22) Filed: Mar. 5, 1999

Related U.S. Application Data (60) Provisional application No. 60/103,693, filed on Oct. 9, 1998.

(51) Int. Cl.[7] .................................................. B65D 85/90
(52) U.S. Cl. ......................... 206/711; 118/500; 206/454; 211/41.18
(58) Field of Search ..................................... 206/454, 710, 206/711, 832, 833; 118/500; 211/41.18

(56) References Cited

U.S. PATENT DOCUMENTS

| | | | | |
|---|---|---|---|---|
| 3,682,083 | * | 8/1972 | Puente .................................... | 118/500 |
| 4,484,538 | * | 11/1984 | Sakosky et al. ...................... | 118/500 |
| 4,566,839 | * | 1/1986 | Butler .................................... | 206/454 |
| 4,569,452 | * | 2/1986 | Schulke ................................. | 206/454 |
| 4,872,554 | * | 10/1989 | Quernemoen ......................... | 206/454 |
| 5,348,151 | * | 9/1994 | Dressen ................................. | 206/454 |
| 5,452,795 | * | 9/1995 | Gallagher et al. ................... | 206/711 |
| 5,960,960 | * | 10/1999 | Yamamoto ............................ | 206/711 |

* cited by examiner

*Primary Examiner*—Jim Foster
(74) *Attorney, Agent, or Firm*—Stallman & Pollock LLP (57) ABSTRACT

A cassette for carrying substantially planar objects. The cassette is formed of only two substantially parallel rods, each rod having spaced apart notches for receiving objects to be carried, together with a pair of end members extending between the rods. The rods and end members are joined to form a substantially rectangular loop.

20 Claims, 9 Drawing Sheets

PROCESS CASSETTE

This application claims the benefit of U.S. Provisional Application No. 60/103,693, filed Oct. 9, 1998.

FIELD OF THE INVENTION

The present invention relates to a method and apparatus for supporting generally planar objects during multistage processing steps, and specifically to a processing cassette having a structure which optimizes exposure to the objects by treatment with rinse fluids and megasonic energy.

BACKGROUND OF THE INVENTION

Numerous products in the high tech area include generally planar components that must be subjected to a number of sequential processing steps. Examples of objects processed in this manner include flat panel displays, optical and magnetic recording disks, photomasks, and silicon wafers from which semiconductor chips are fabricated. For the sake of simplicity, the present invention is discussed below with reference to the manufacture of semiconductor devices from silicon wafers. However, this is not intended to limit in any way the scope of applications to which the cassette of the present invention may be applied.

Surface processing of silicon wafers to make semiconductor devices such as integrated circuits involves a number of stages, with the wafers being exposed to many different processing steps. Wafers are placed in process vessels where they are repeatedly subjected to heated chemicals, such as sulfuric acid. The wafers are also rinsed and cleaned between processing steps. For optimum process performance, it has become customary for the wafers to be confined within specially-constructed relatively low mass cassettes having customized interfaces with the process vessels and/or with the robots or other machinery used to transport the cassettes during processing.

In general, the wafers are arranged in a linear array configuration within the cassette, with sufficient space between each wafer to allow exposure to the various chemicals necessary for processing, and to prevent contact between adjacent wafers. The cassette is typically rigid in order to maintain the required spacing between the wafers, even under the relatively high temperatures to which the cassette is exposed.

Figure 1A:
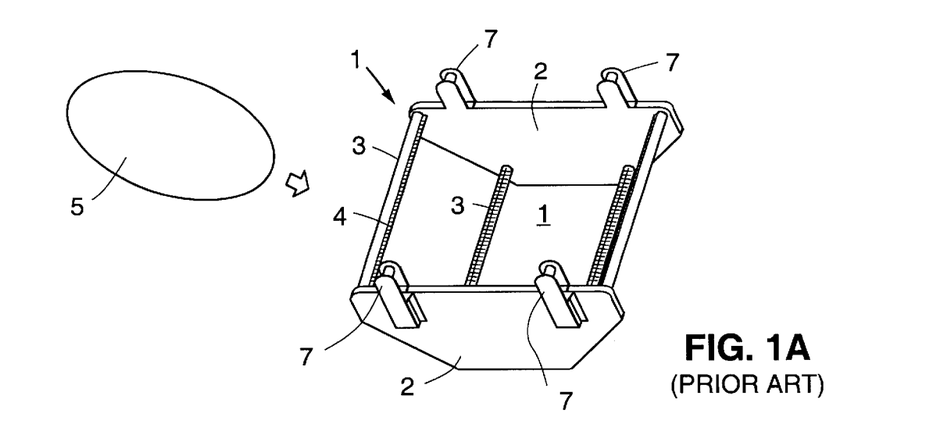
FIGS. 1A–1D show views of a conventional rigid four-bar wafer cassette.
Figure 1B:
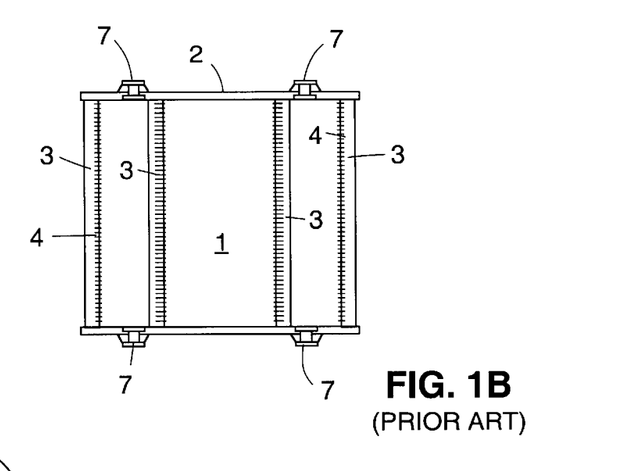
Figure 1C:
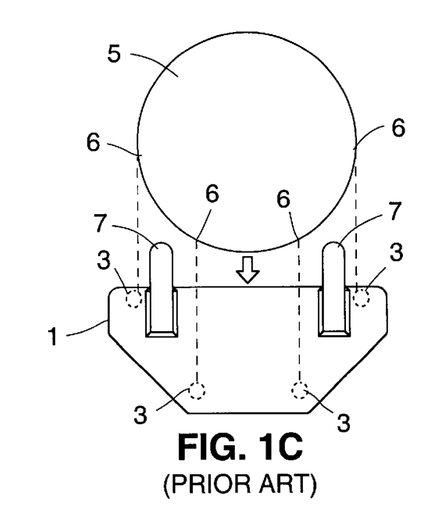
Figure 1D:
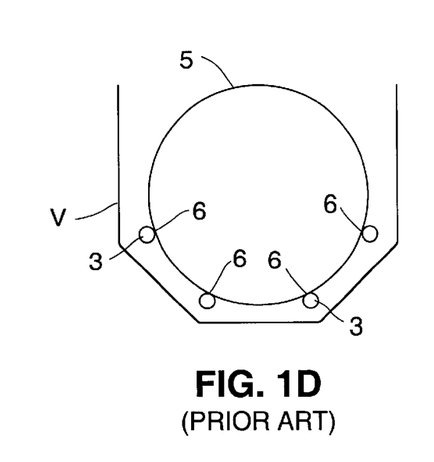

One of the most common wafer cassette designs currently used is the rigid four-bar cassette shown in FIGS. 1A–1D. Such a prior art cassette is described in U.S. Pat. No. 4,872,554. FIGS. 1A–1C show perspective, top, and end views, respectively, of a conventional rigid four-bar wafer cassette. Rigid endplates 2 secure the ends of each of the rigid bars or rods 3. Rigid bars 3 have combs or "teeth" 4 adapted to accept and separate inserted wafer(s) 5. During use of the four-bar cassette, an inserted wafer is intended to come into contact with the cassette 1 at four different points 6, as shown in FIG. 1D. The cassette and wafers are lowered into a process vessel V for treatment of the wafers.

While considered a great improvement over more conventional cassettes, the four-bar cassette leaves further room for improvement. For example, in the semiconductor fabrication industry it is desirable to minimize the volume of process vessels, as this in turn minimizes the volume of processing chemicals and rinse fluids needed to fill the vessels. It is for this reason that the wet processing vessels are often designed to conform as closely as possible to the size and shape of the wafers undergoing processing. Development of the four-bar cassette was a step towards reducing the outer profile of the cassette. However, the support bars and end plates of the four-bar create a relatively large outer profile for the cassette, which still must be accommodated by a fairly large vessel interior. Handles 7, which are engaged by a wafer handling system during transport of the cassette, further contribute to the bulk of the cassette.

It is thus desirable to configure a wafer cassette having a further reduced outer profile so as to allow for the use of even smaller processing vessels and thus smaller quantities of process fluids.

Another area of improvement relates to the "shadowing" effects that cassettes can have on rinse fluids and/or megasonic energy that is directed towards the wafers during processing. During cleaning applications in which the wafers are immersed in a cleaning solution, megasonic energy may be directed towards the wafers using one or more megasonic transducers. The resulting agitation of the cleaning solution is sufficiently powerful to remove particles from the surfaces of the wafers.

Typically, the megasonic transducers are oriented to direct megasonic energy towards the wafers from the bottom of the process vessel V. Because the four-bar cassette contacts each wafer at four points along the lower wafer edge (see FIG. 1D), the bars obstruct megasonic energy and can impair the effectiveness of the megasonic cleaning process. Many rinse tanks come equipped with specialized megasonic transducer arrangements designed to minimize the effects of the cassette structure on the megasonic energy patterns.

A similar shadowing phenomenon can occur during cleaning or rinse procedures in which fluids are directed upwardly into the vessel from the vessel bottom. Such shadowing effects can prevent the fluids from adequately reaching certain regions of the wafer surface, leaving undesirable streaks of particles. It is thus further desirable to provide an improved cassette designed to minimize obstruction of megasonic energy and rinse fluid flow patterns by cassette components.

A better understanding of the features and advantages of the present invention will be obtained by reference to the detailed description and accompanying drawings given below. The following description and drawings illustrate a rigid cassette useful for transporting silicon wafers during semiconductor processing steps. However, it is important to recognize that the cassette design shown and described herein represents only one particular embodiment utilizing principles of the present invention.

SUMMARY OF THE INVENTION

The present invention is a cassette for carrying substantially planar objects. The cassette is formed of only two substantially parallel rods, each rod having spaced apart notches for receiving objects to be carried, together with a pair of end members extending between the rods. The rods and end members are joined to form a substantially rectangular loop.

BRIEF DESCRIPTION OF THE DRAWINGS

The invention will be better understood by reference to the appended figures, in which.

DETAILED DESCRIPTION

As discussed above, a cassette in accordance with the present invention may be utilized for handling a number of relatively flat or planar objects are suitable for handling during processing. For illustrative purposes, a cassette as equipped for handling silicon wafers is shown below.

Figure 2:
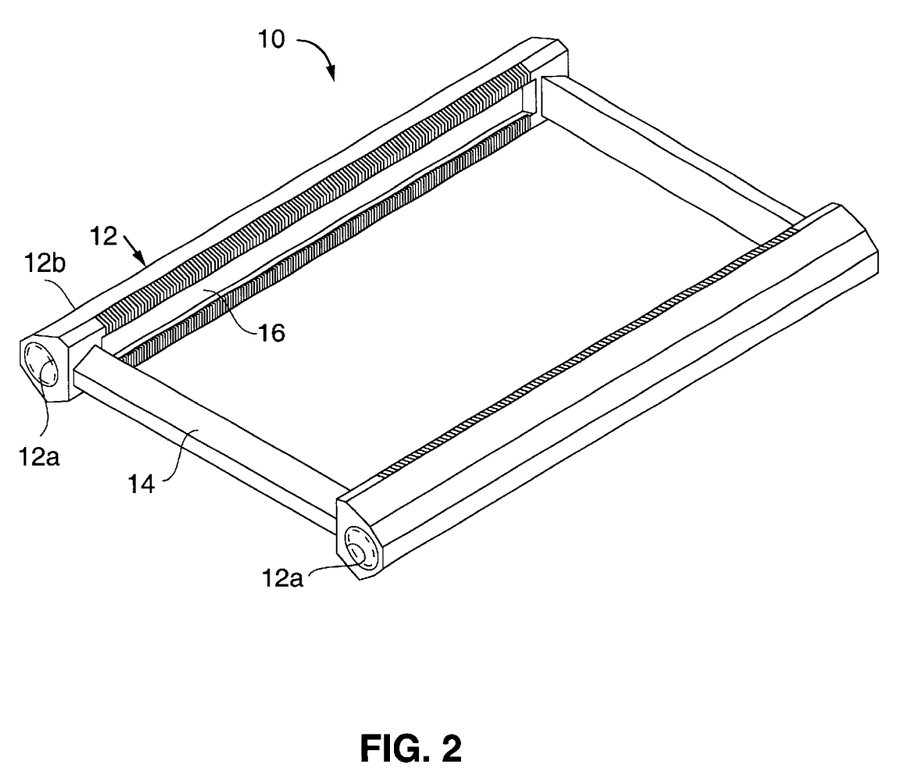
FIG. 2 is a perspective view of a cassette in accordance with one embodiment of the present invention.
Figure 3:
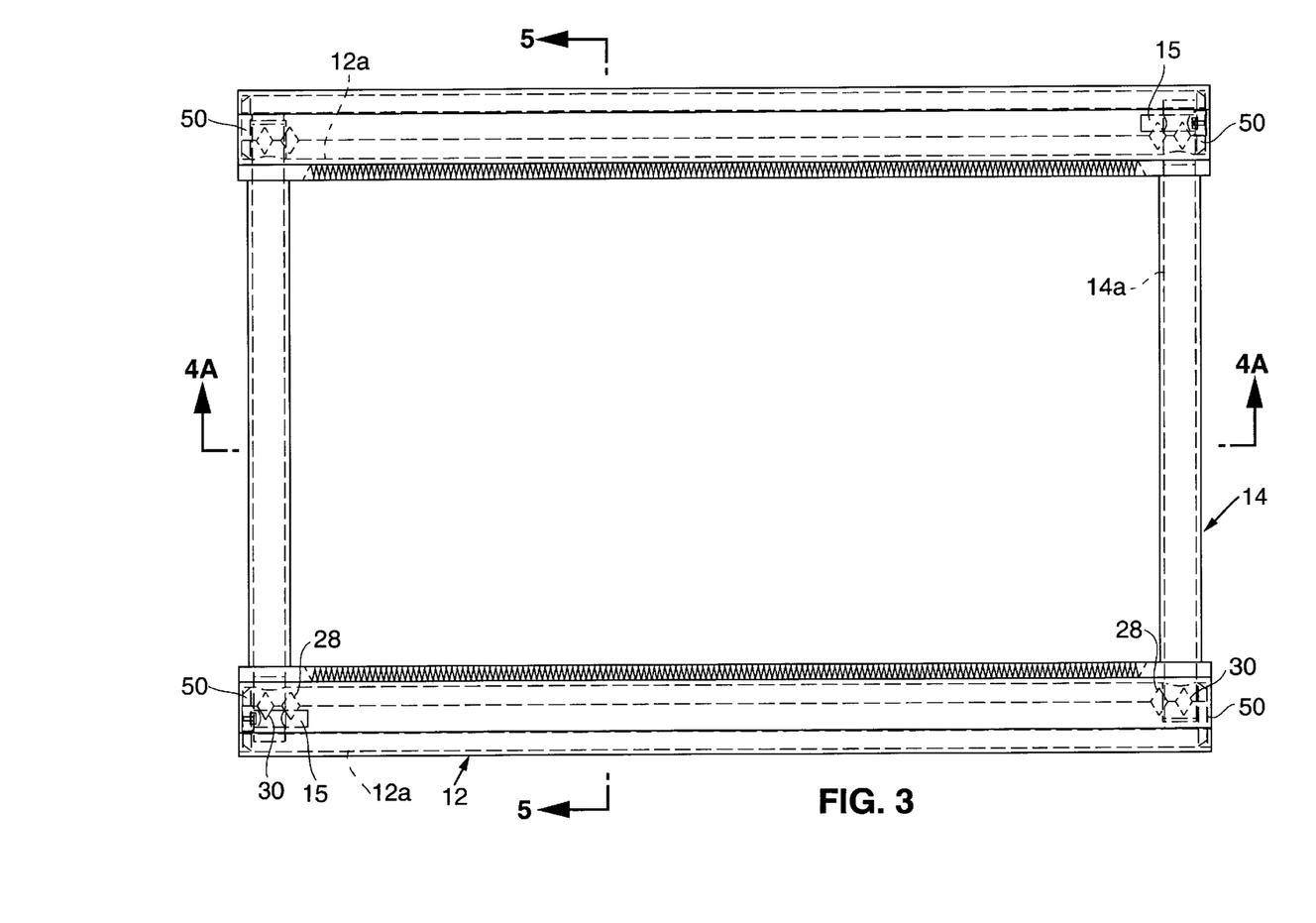
FIG. 3 is a top plan view of the cassette of FIG. 2.

Referring to FIGS. 2 and 3, one embodiment of a cassette 10 according to the present invention is formed of a pair of side bars 12 joined with a pair of end bars 14 to form a rectangular loop.

Figure 4A:
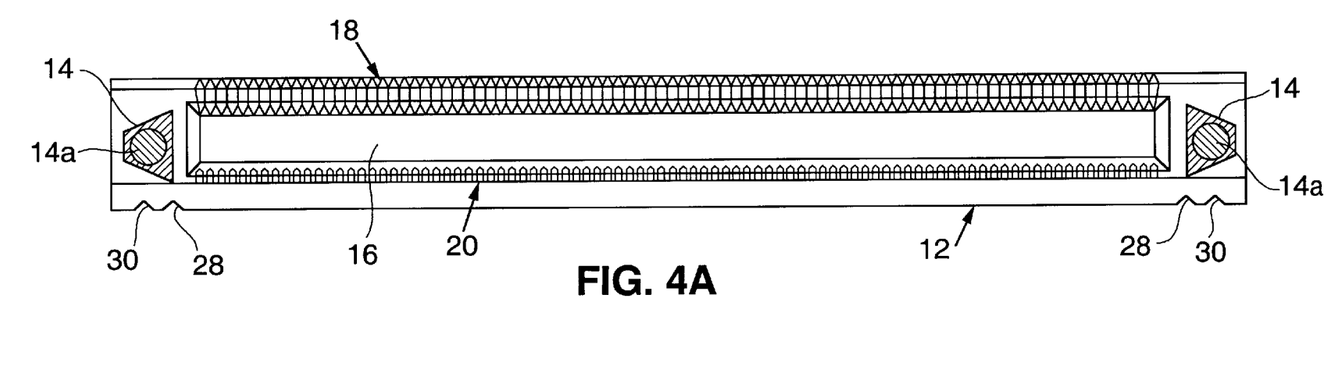
FIG. 4A is a cross-sectional side view taken along the plane designated 4A—4A in FIG. 3.
Figure 5:
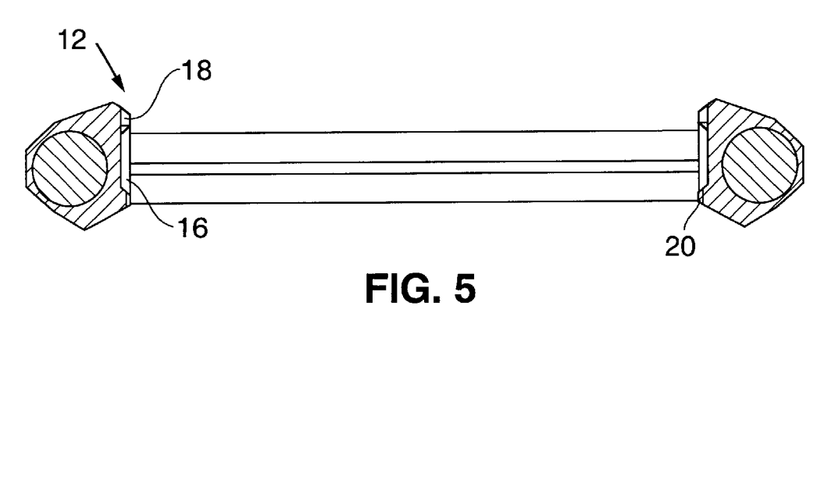
FIG. 5 is a cross-sectional end view taken along the plane designated 5—5 in FIG. 3.

An elongate recess 16 extends along the interior surface of each side bar 12, as best shown in FIGS. 2, 4A and 5. A plurality of spaced-apart upper notches 18 are formed above the recess 16, and corresponding lower notches 20 are formed below the recess 16. The notches are preferably formed such that the region lying between adjacent notches rises to a point so as to break the surface tension of rinse water falling on the cassette during use.

Referring again to FIGS. 3 and 4, inner and outer notches 28, 30 are formed on the underside of the side bars 12. These notches allow the cassette to be engaged by end effectors, hooks or other engaging elements on a wafer handling system and elevated for movement between process steps. These notches are advantageous in that they eliminate the need for bulky hardware on the cassette itself.

Figure 6:
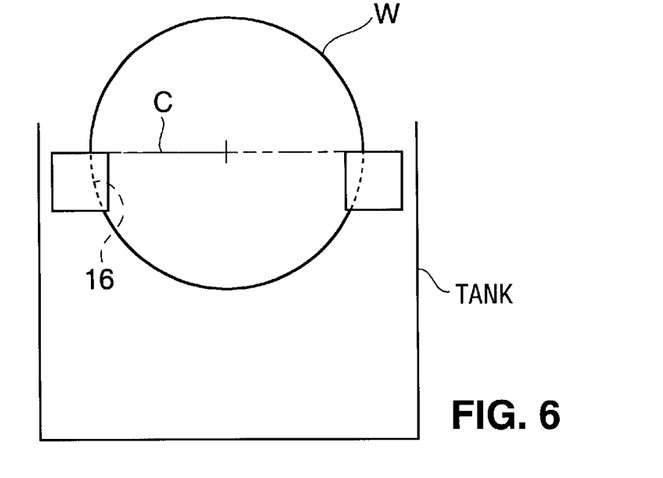
FIG. 6 is a cross-sectional end view showing the cassette of FIG. 2 holding a wafer and positioned in a process vessel.

During use, each wafer W is positioned within the cassette with its side edges resting in the notches as shown in FIG. 6. As shown, the portion of the wafer edge extending between the upper and lower notches extends into the recesses 16. Preferably, each side edge of the wafer W contacts the cassette at a first point that is approximately at the centerline C of the wafer, and at a second point spaced slightly below the centerline.

Although the bars 12, 14 may have any suitable shape without departing from the scope of the present invention, the shapes of the bars and cassette are preferably selected to promote good fluid flow within the vessel and around the wafers. Moreover, the cross-sectional shapes of the bars 12, 14 are selected to minimize pooling of process fluids on the cassette and to promote shedding of liquid droplets from the wafer surfaces. This has been found particularly important with respect to the end bars 14, which during use are positioned immediately adjacent to the first and last wafers in the cassette.

Figure 4B:
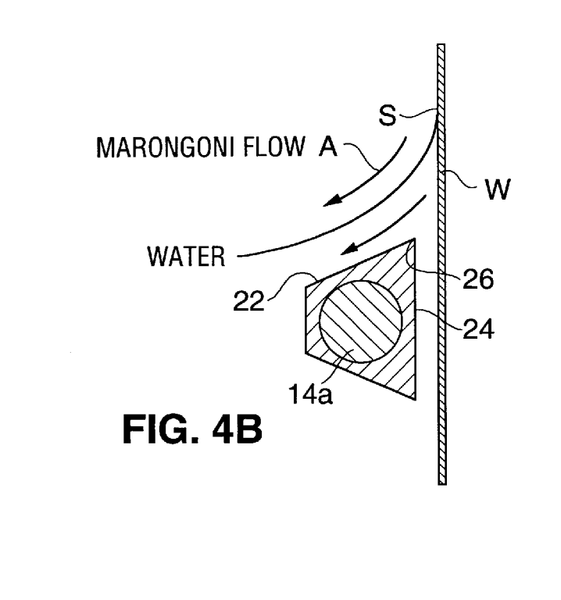
FIG. 4B is a cross-sectional side similar to FIG. 4A schematically illustrating the flow of drying vapor and rinse fluid over the end bars of the cassette during its use with a Marongoni-type drying process.

FIG. 4B illustrates a cross-section view of one of the end bars 14 and a directly adjacent wafer W. The end bar includes a top face 22 which is angled away from the wafer surface. A more vertical side face 24 forms a point 26 with top face 22 adjacent, to the wafer surface. Point 26 breaks the surface tension of rinse water contacting end bar 14 and in doing so helps to minimize accumulation of rinse water on the cassette. The orientation of top face 22 allows wafers to be positioned in close proximity to the end bar while preventing the end bar from interfering with the flow of droplets away from the wafers.

More specifically, during Marongoni-type drying procedures, an IPA vapor is condensed on top of the rinse water containing the wafers as the wafers are slowly lifted from the processing vessel (or as the rinse water is slowly drained from the vessel). Referring to FIG. 4B, the concentration of the dissolved vapor is highest at the wafer surfaces S and lower at regions of the rinse fluid that are spaced from the wafer surfaces. Because surface tension decreases as IPA concentration increases, the surface tension of the water is lowest at the wafer surface where the IPA concentration is highest. The concentration gradient thus results in "Marongoni flow" of the rinse water away from the surfaces of the wafers as indicated by arrow A. Rinse water is thereby stripped from the wafer surfaces, leaving the wafer surfaces dry.

Angled top face 22 is oriented so as not to interrupt the Marongoni flow of the rinse fluid in the region surrounding the end bar. Instead, the top face allows rinse fluid in the region to flow off the wafer onto the end bar 14 as represented by arrow A2.

Figure 10A:
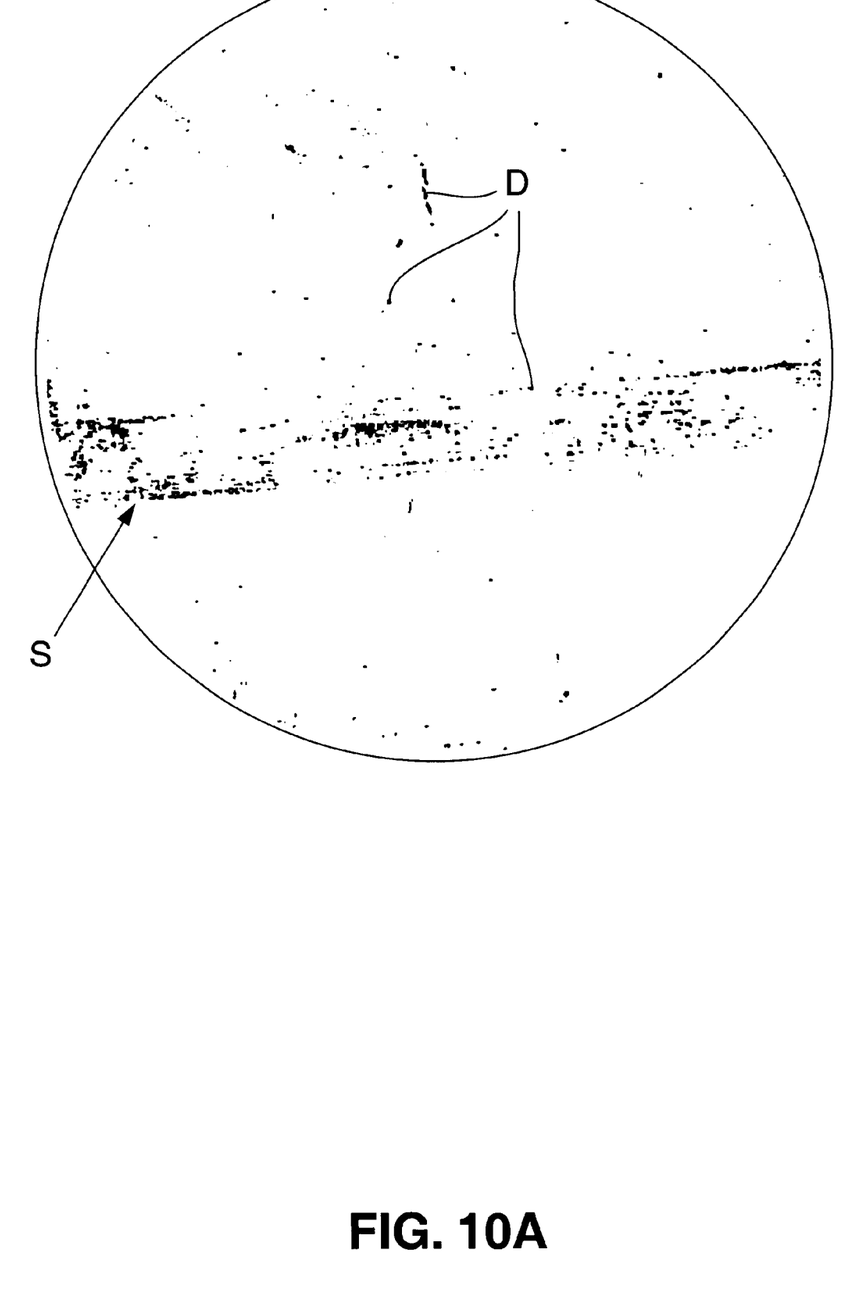
FIGS. 10A and 10B represent surface scans of wafers following tests performed using two cassettes according to the present invention, each cassette possessing a different cross-section for the end bars.
Figure 10B:
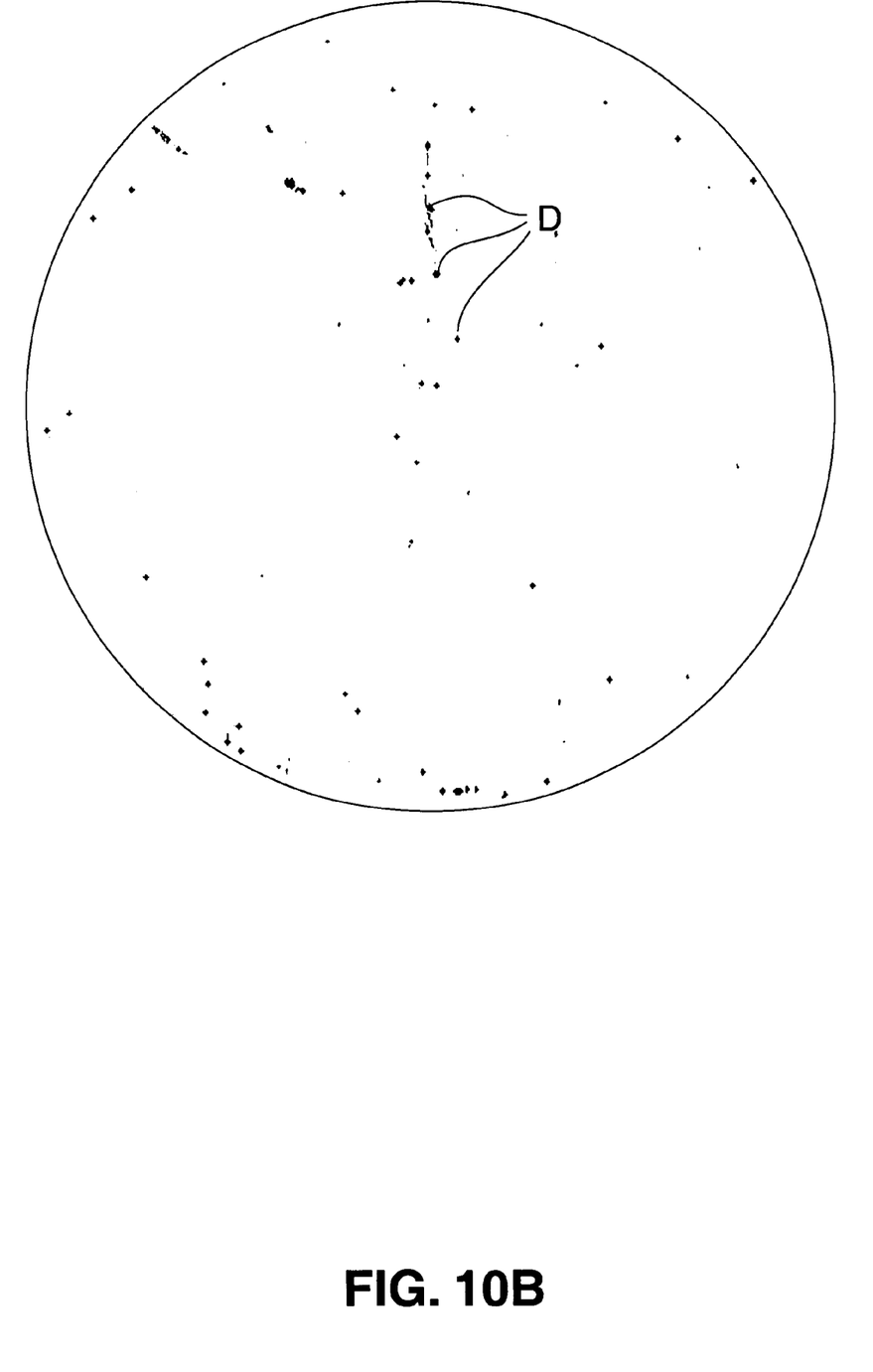

The significance of selecting an end bar cross-section that will not disturb Marongoni flow has been demonstrated experimentally and is illustrated in FIGS. 10A and 10B. These figures show surface scans of wafers following test runs in which the wafers were rinsed and dried while positioned in the first or last wafer position (i.e. the end position) in a cassette according to the present invention. FIG. 10A represents a wafer rinsed and dried while positioned in a cassette that is similar to the cassette 10 but which has end bars having cross-sectional shapes that are more diamond-like. FIG. 10B represents a wafer cleaned while positioned in the cassette 10, utilizing the cross-sectional end bar configuration shown in FIGS. 4A and 4B. The black dots D shown on the wafers illustrate particles found on the wafers following drying. As can be seen, the FIG. 10A wafer includes a streak S of particles in the region lying adjacent to the cassette's end bar. The streak of particles indicates that wafer remained on the wafers at the end of the drying process, and ultimately dried by evaporation, leaving the particles behind.

Turning to the subject of materials selection, the process cassette must be formed of materials having sufficient strength and modulus of elasticity to allow them to withstand the loads exerted upon them by the wafers they support with minimal deflection. The materials must also be suitable for use in harsh process environments such as within tanks of hot chemicals. Various materials are available which meet these criteria, and it should be understood that the scope of the present invention is not limited by choice of materials.

In one embodiment, bars 12, 14 are formed of PFA (perfluoroalkoxy) Teflon® brand material available from DuPont Corporation (hereinafter referred to for simplicity as PFA) reinforced using rods 12a, 14a of Celezole PBI.

During manufacture, laterally extending bore holes are formed in each Celezole side rod 12a. Threads are formed at the ends of Celezole end rods 14a. The side and end rods are then screwed together to form a frame. As can be seen in FIG. 3, Celezole screws 15 secure the connections between the rods at two diagonally opposed corners of the frame.

Figure 11:
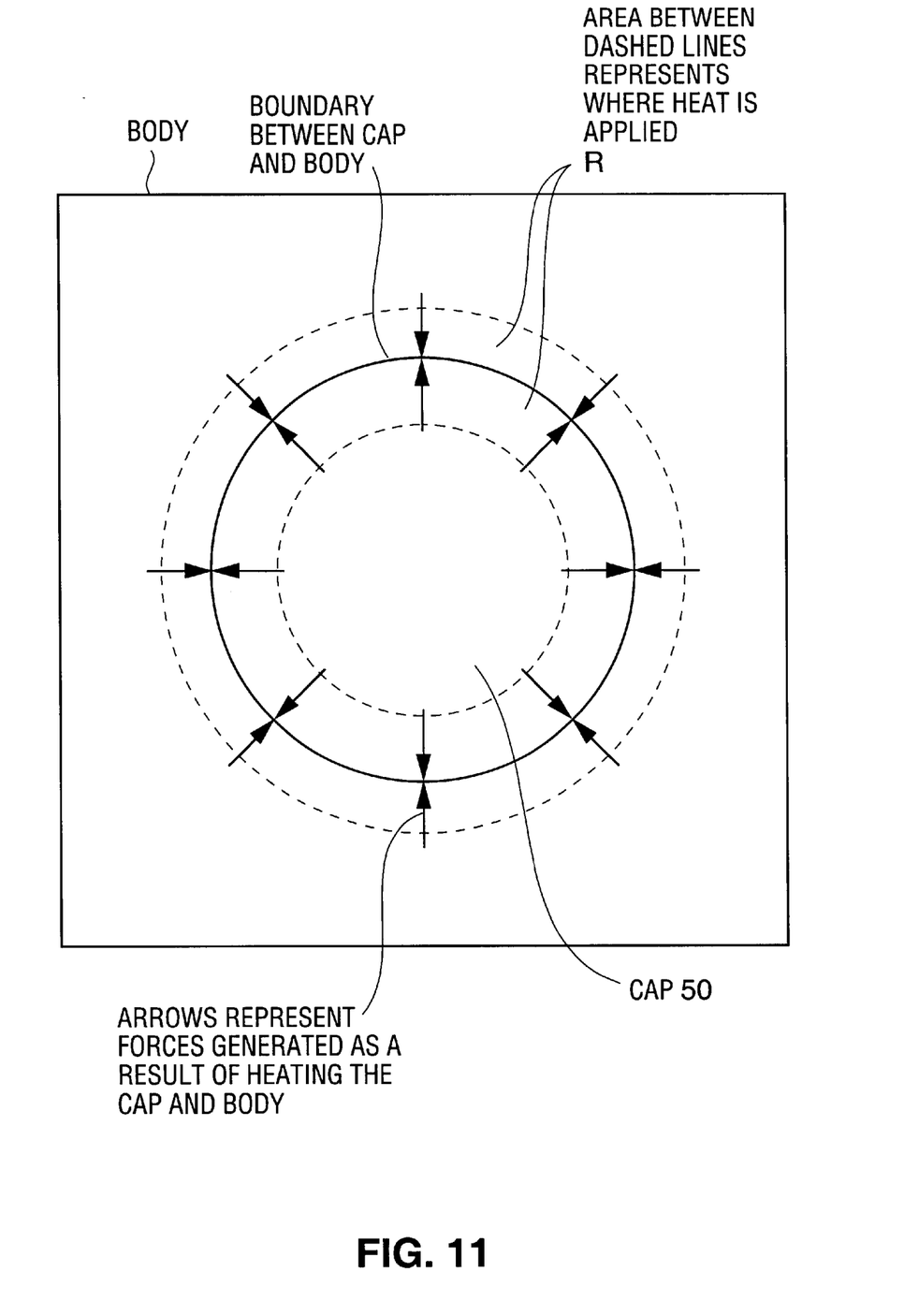
FIG. 11 is a plan view illustrating a technique for welding a cap into an opening, which may be suitable for use in constructing the cassette of FIG. 1.

The PFA is machined or molded over the frame, and welds (not shown) are formed to seal the Celezole within the PFA, preferably using the welding technique described with respect to FIG. 11. In the drawings, the regions of PFA surrounding the rods 12a, 14a are designated 12b, 14b.

PFA is a material preferred for ultra clean applications such as the fabrication of semiconductors because it exhibits high resistance to a broad variety of chemicals, and is not readily contaminated by other materials. A disadvantage of PFA, which is overcome in the manner described below, is its high coefficient of thermal expansion. Moreover, PFA has a modulus of elasticity that significantly decreases with increases in temperature, and thus becomes weaker in hot environments.

Celezole PBI is particularly suitable as a reinforcing material for the cassette 10. It has a high modulus of elasticity (approximately 1 million), an operating temperature of approximately 800 F, and strength of approximately 23,000 psi. Celezole has a coefficient of thermal expansion that is approximately ⅕ that of PFA, and does not exhibit a significant decrease in its modulus with increases in temperature. Significantly, its material properties are not directionally dependent, so that threads can be cut into it without compromising its integrity. Also important is that Celezole will not corrupt the process environment if welds in the PFA should fail during use. Metal reinforcing materials are typically undesirable for this reason. Naturally, other reinforcing materials such as polyetherkeytone, commonly known as "PEEK" and commercially available from DuPont Corporation, may be used in place of or in addition to the Celezole material. For example, PEEK reinforcing rods may extend through the Celezole reinforcing rods if additional strength is needed against deflection of the side bars during loading.

The design of the bars 12, 14 takes into account the material properties of Celezole and PBI in a manner which controls expansion of the cassette. This control is directed towards keeping the separation distance between the side bars 12 and the axial spacing between notches 18, 20 relatively constant despite significant temperature changes.

One concern raised by the large coefficient of thermal expansion possessed by PFA relates to its contribution to axial expansion of the cassette and thus to potentially large increases in the axial spaces between the notches 18, 20 (FIG. 4) that support the wafers during use. Large increases in notch spacing can give the wafers significant play within the notches, and can result in movement of the wafers within the cassette. Wafer movement can lead to potential wafer damage, and tilting of wafers towards one another can result in undesirable formation of water bridges between closely adjacent wafer surfaces during rinsing.

Use of Celezole as a reinforcing material allows the axial expansion of the PFA, and thus increases in notch spacing, to be controlled. As discussed, Celezole has a far lower coefficient of thermal expansion than does PFA, and it does not experience a significant decrease in modulus with temperature increases in the temperature range of interest. Because PFA weakens as it becomes hotter, its axial expansion is thus restrained by the more limited axial expansion of the Celezole.

Figure 7A:
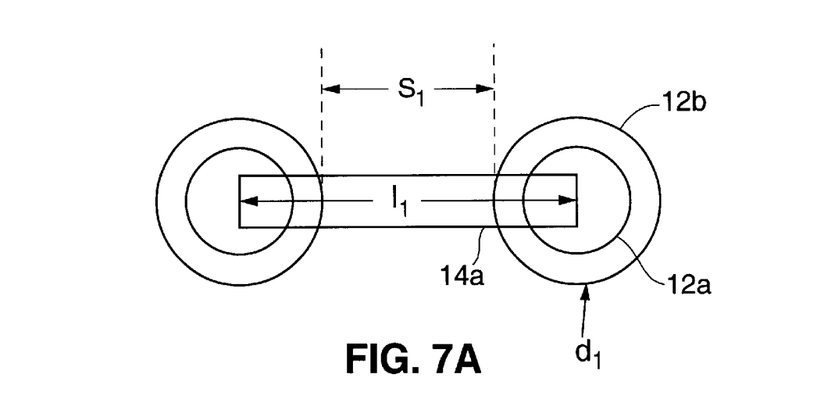
FIGS. 7A and 7B are schematic end views of the wafer cassette of FIG. 2, illustrating the effects of thermal expansion on the cassette geometry.
Figure 7B:
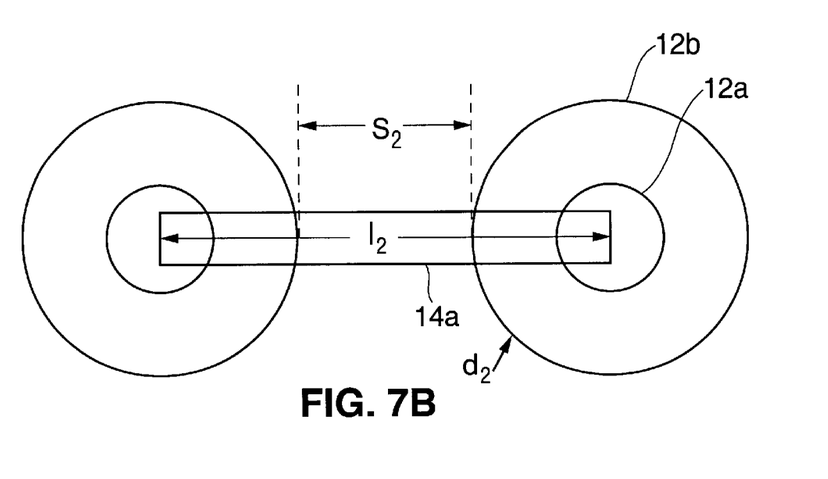

The preferred materials selection also addresses concerns with regard to the effects expansion of the cassette materials can have on the separation distance between the side bars 12. FIGS. 7A and 7B represent first and second end views of the cassette 10. FIG. 7A represents the cassette at room temperature, $T_1$, and FIG. 7B represents the cassette at an elevated temperature $T_2$. $S_1$ and $S_2$ represent the separation distance between the side rods 12 at temperatures $T_1$ and $T_2$, respectively. An increase in this separation distance can cause the wafers to slip within the cassette or even to drop out of the cassette, while a decrease in separation can cause the wafers to be squeezed and possibly damaged by the cassette. It is thus necessary to limit the effect that thermal expansion will have on the separation distance during use.

As temperature is increased, end bar 14 increases in its axial length from $I_1$ to $I_2$, thereby increasing the center to center distances between the side bars 12. With the same change in temperature, however, the significant radial expansion of the PFA in side members 12 increases the diameters of the side members from $d_1$ to $d_2$, leaving the separation distance $S_2$ between the side members 12 substantially the same as it was ($S_1$) at the lower temperature. The dimensions of the Celezole and PFA rods and members are thus selected so that the radial expansion of side bars 12 and the axial expansion of the end bars 14 approximately offset one another when the cassette is exposed to high temperature conditions.

The PFA's thermal expansion properties may be utilized in the welding process used to seal the reinforcing rods 12a within the PFA bodies 12b. Referring back to FIG. 3, during manufacture of the cassette, PFA caps 50 are welded into openings at each end of the PFA bodies 12b. A welding process has been developed in which radiant heat is applied to the cap and surrounding body material in a manner that causes radial outward expansion of the cap and radial inward expansion of the PFA body material surrounding the cap.

Referring to FIG. 11, in a preferred use of the welding technique, radiant heat is applied in an annular region such as the region designated R in FIG. 11. Annular region R includes the perimeter of the cap and the perimeter of the opening in the body material. A heater having a ring-shaped heating coil is particularly suitable for this purpose.

During use of the welding technique, the radiant heating coil is activated and placed in close proximity to region R. The radiant heat softens annular region R, causing radial outward expansion of the cap and radial inward expansion of the PFA body material surrounding the cap. The opposed forces of expansion press the cap material and the surrounding material together as illustrated by arrows in FIG. 11, leading to a secure weld between the cap and surrounding material.

Although this welding technique is described for use in manufacturing a process cassette, it should be noted that the technique is useful in any process in which materials are to be welded together, particularly plastics given their high coefficients of thermal expansion. It is highly useful in welding together Teflon® fluoropolymer materials due to their particularly high coefficients of thermal expansion.

During one method for using the cassette 10, the cassette is loaded with wafers, its notches 28 and/or 30 are engaged by end effectors (not shown) of a handling system, and it is then lowered into a process vessel by the handling system. The cassette may be positioned on support structures within the vessel or it may be suspended within the tank throughout processing. As an alternative, the cassette 10 may be designed to itself form a part of an enclosed process vessel.

Figure 8:
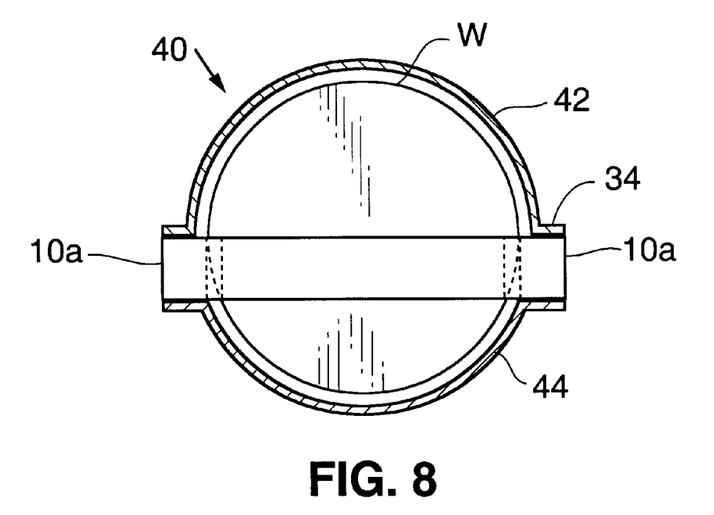
FIG. 8 is an end view showing a second embodiment of a cassette forming a portion of an enclosed process vessel.
Figure 9:
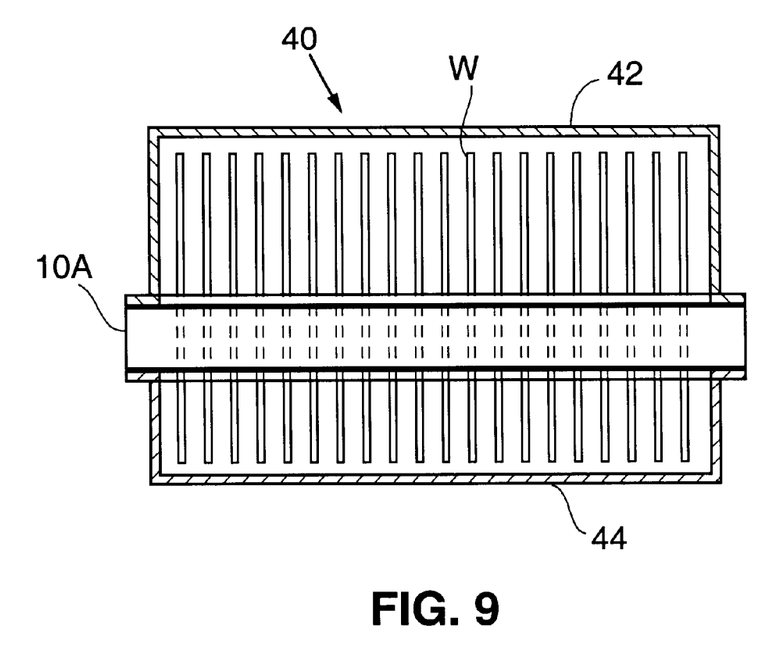
FIG. 9 is side elevation view of the cassette and vessel embodiment of FIG. 8.

Referring to FIGS. 8 and 9, a cassette 10a, which may be similar to the cassette 10 of FIG. 2, is provided together with a sealable process vessel 40 having a top section 42 and a bottom section 44. The cassette 10a is configured such that, once loaded with wafers, it is positioned between the top and bottom sections as shown in FIG. 8. The closed vessel is then filled with processing fluids needed to treat the wafers.

The overall shape of the closed vessel is preferably selected to conform to the wafers carried by the cassette in order to minimize the vessel's volume and thus minimize consumption of processing fluids. To this end, the vessel is preferably provided with side flanges 34 that receive and seal against the loop cassettes side bars.

While the subject invention has been described with reference to preferred embodiments, various changes and modifications could be made therein, by one skilled in the art, without varying from the scope and spirit of the subject invention as defined by the appended claims.

What is claimed is:

1. A cassette for carrying substantially planar objects, the cassette comprising:

only two substantially parallel rods, each rod having spaced apart notches for receiving objects to be carried, wherein the rods include inwardly facing sides facing towards one another and outwardly facing sides facing away from one another; and a pair of end members extending between the rods, the rods and members having an unexpanded condition in which the inwardly facing sides spaced by a first separation distance and the outwardly facing sides spaced by a second separation distance, the rods and members thermally expandable to an expanded condition in which the inwardly facing sides are spaced by a third separation that is substantially equivalent to the first separation distance, and wherein the outwardly facing sides are spaced by a fourth separation distance that is greater than the second separation distance.

2. The cassette according to claim 1 further including elongate reinforcing members attached to the rods.

3. The cassette according to claim 2 wherein the elongate reinforcing members attached to the rods extend axially through the rods.

4. The cassette according to claim 1 further including elongate reinforcing members attached to the end members.

5. The cassette according to claim 4 wherein the elongate reinforcing members attached to the end members extend axially through the end members.

6. A cassette according to claim 1 wherein the rods and end members are joined to form a substantially rectangular loop.

7. A cassette for carrying substantially planar objects, the cassette comprising:

a pair of substantially parallel rods, each rod having spaced apart notches for receiving objects to be carried; and a pair of end members extending between the rods; and a reinforcing member attached to each rod, wherein each rod is formed of a material which, in the absence of a reinforcing member, would have a first axial length at a first temperature and a second, longer, axial length at a second, higher temperature, and wherein each reinforcing member is formed of a material capable of restraining the rod against thermal expansion such that the rod has a notch spacing at the second temperature that is substantially equal to the notch spacing at the first temperature.

8. A cassette according to claim 7, wherein the rods and end members are joined to form a substantially rectangular loop.

9. The cassette according to claim 7, further including reinforcing members attached to the end members.

10. The cassette according to claim 9 wherein the reinforcing members attached to the end members extend axially through the end members.

11. The cassette according to claim 7, wherein the rods have undersides and notches formed on the undersides, the notches engageable with a cassette carrier.

12. The cassette according to claim 7 wherein the reinforcing members extend axially through the rods.

13. A cassette for carrying substantially planar objects, the cassette comprising:

two substantially parallel rods, each rod having spaced apart notches for receiving objects to be carried, and a pair of end members extending between the rods, and reinforcing members in the rods and end members, wherein the cassette is formed of PFA material and wherein the reinforcing members are formed of polybenzimidizole.

14. A cassette according to claim 13 wherein the rods and end members are joined to form a substantially rectangular loop.

15. A cassette for carrying substantially planar objects, the cassette comprising:

a pair of substantially parallel rods, each rod having spaced apart notches for receiving objects to be carried; and a pair of end members extending between the rods, wherein the notches are oriented to support planar objects such that each planar object occupies a plane that is parallel to the planes of the other planar objects, and wherein each end member includes an upper surface having a substantially planar portion having an angle that is oblique to the planes.

16. A cassette according to claim 15 further including reinforcing members extending axially through to the rods.

17. A cassette according to claim 8 further including reinforcing members extending axially through the end members.

18. A cassette according to claim 15 wherein the rods and end members are joined to form a substantially rectangular loop.

19. A cassette for carrying substantially planar objects, the cassette comprising:

a pair of substantially parallel rods, each rod having spaced apart notches for receiving objects to be carried, a pair of end members extending between the rods, and reinforcing members in the rods, wherein the rods are formed of PFA material and wherein the reinforcing members are formed of polybenzimidizole.

20. A cassette for carrying substantially planar objects, the cassette comprising:

a pair of substantially parallel rods, each rod having spaced apart notches for receiving objects to be carried, a pair of end members extending between the rods, and reinforcing members in the end members, wherein the rods are formed of PFA material and wherein the reinforcing members are formed of polybenzimidizole.

* * * * *